United States Patent [19]

Brooks

[11] Patent Number: 5,220,288
[45] Date of Patent: Jun. 15, 1993

[54] CONTINUOUS-TIME DIFFERENTIAL AMPLIFIER WITH LOW OFFSET VOLTAGE

[75] Inventor: Todd L. Brooks, Austin, Tex.

[73] Assignee: Motorola, Schaumburg, Ill.

[21] Appl. No.: 891,018

[22] Filed: Jun. 1, 1992

[51] Int. Cl.$^5$ ............................................... H03F 3/45
[52] U.S. Cl. .................................. 330/255; 323/313; 330/257; 330/261
[58] Field of Search .................. 330/257, 255, 261; 323/313

[56] References Cited

U.S. PATENT DOCUMENTS

| | | | |
|---|---|---|---|
| 4,360,785 | 11/1982 | Schade, Jr. | 330/257 X |
| 4,542,348 | 9/1985 | Lucas et al. | 330/255 X |
| 4,555,670 | 11/1985 | Tanaka | 330/257 X |
| 4,583,009 | 4/1986 | Eng, Jr. | 323/313 X |
| 4,598,215 | 7/1986 | Schechtman et al. | 307/355 |
| 4,739,281 | 4/1988 | Doyle | 330/255 X |

OTHER PUBLICATIONS

Vittoz, Eric A., "MOS Transistors Operated in the Lateral Bipolar Mode and Their Application in CMOS Technology," *IEEE Journal of Solid State Circuit*, vol. SC-18, No. 3, Jun. 1983.

Primary Examiner—James B. Mullins
Attorney, Agent, or Firm—Paul J. Polansky; Maurice Jay Jones

[57] ABSTRACT

A continuous-time differential amplifier (52, 100) preserves fast settling time while reducing a relatively-high offset voltage-normally associated with a continuous-time differential amplifier using MOS load transistors. The differential amplifier (52, 100) includes a first transistor (81) biased as a current source to provide current into emitters of second (82) and third (83) emitter-coupled input transistors. Fourth (84) and fifth (85) load transistors are respectively coupled between collectors of the second (82) and third (83) input transistors and a power supply voltage terminal. An amplifier (70) having a positive input terminal coupled to the collector of the second input transistor (82) and a negative input terminal receiving a bias voltage biases the control electrodes of the load transistors (84, 85). The amplifier (70) increases the effective transconductance of the load transistors (84, 85) to allow larger control electrode areas, which reduces the effect of transistor mismatch.

7 Claims, 4 Drawing Sheets

[5,220,288]

CONTINUOUS-TIME DIFFERENTIAL AMPLIFIER WITH LOW OFFSET VOLTAGE

FIELD OF THE INVENTION

This invention relates generally to amplifiers, and more particularly, to continuous-time differential amplifiers with low offset voltage.

BACKGROUND OF THE INVENTION

In some applications such as telecommunications it is necessary to convert signals from analog form to digital form and vice versa. These conversions are performed respectively in an analog-to-digital converter (ADC) and a digital-to-analog converter (DAC). The data converters need fixed, temperature-insensitive reference voltages for best performance. These fixed reference voltages are commonly provided by a circuit known as a bandgap voltage reference circuit. The bandgap voltage reference circuit provides an output voltage which is stable over wide ranges of temperature by summing the difference in voltage across two bipolar transistors with different current densities with the voltage across a single bipolar transistor, and many such circuits are known in the art.

However, the data converters may require one or more reference voltages that are different than the bandgap reference voltage. For such a case, a differential amplifier can provide the reference voltage by utilizing a resistor divider network in a negative feedback configuration. The differential amplifier also provides the advantage of buffering the output of the bandgap voltage reference circuit to prevent it from being affected by changes in the load.

Deriving a voltage in this way involves a tradeoff between offset voltage and settling time. Any offset voltage in the differential amplifier changes the value of the reference voltage from the desired voltage. The settling time of the differential amplifier determines how quickly the reference voltage returns to its desired value after the load is changed. Ideally, the differential amplifier needs a very low offset voltage and a very fast settling time. One known approach is to use a switched-capacitor amplifier. The switched-capacitor amplifier makes possible low offset voltages, within the matching of the capacitors, through known offset compensation techniques. However, the switched-capacitor amplifier may load the output of the bandgap voltage reference circuit and cause a relatively-long settling time, for example when the bandgap voltage reference circuit uses an MOS process with parasitic vertical bipolar transistors. Furthermore, the switched-capacitor amplifier doesn't provide a continuous reference voltage at its output and is susceptible to noise which occurs during switching.

A second approach is to use a continuous-time amplifier. Known continuous-time amplifiers provide continuous reference voltages at their outputs, and do not load the bandgap voltage reference circuit, thus limiting settling time to the settling time of the amplifier itself. However they also suffer from higher offset voltages than switched-capacitor amplifiers which use the known compensation techniques referred to above. Known techniques of reducing the offset voltage of the continuous-time amplifier cause a corresponding increase in settling time. Thus what is needed is a continuous-time differential amplifier which provides both a low offset voltage and a fast settling time.

SUMMARY OF THE INVENTION

Accordingly, there is provided, in one form, a continuous-time differential amplifier with low offset voltage comprising first through fifth transistors and an amplifier. The first transistor has a first current electrode coupled to a first power supply voltage terminal, a control electrode for receiving a first bias voltage, and a second current electrode. The second transistor has an emitter coupled to the second current electrode of the first transistor, a base for receiving a negative input signal, and a collector. The third transistor has an emitter coupled to the second current electrode of the first transistor, a base for receiving a positive input voltage, and a collector for providing an output signal. The fourth transistor has a first current electrode coupled to the collector of the second transistor, a control electrode, and a second current electrode coupled to a second power supply voltage terminal. The fifth transistor has a first current electrode coupled to the collector of the third transistor, a control electrode, and a second current electrode coupled to a second power supply voltage terminal. The amplifier has a positive input terminal coupled to the collector of the second transistor, a negative input terminal for receiving a second bias voltage, and an output terminal coupled to the control electrodes of the fourth and fifth transistors.

These and other features and advantages will be more clearly understood from the following detailed description taken in conjunction with the accompanying drawings.

DETAILED DESCRIPTION OF A PREFERRED EMBODIMENT

Figure 1:
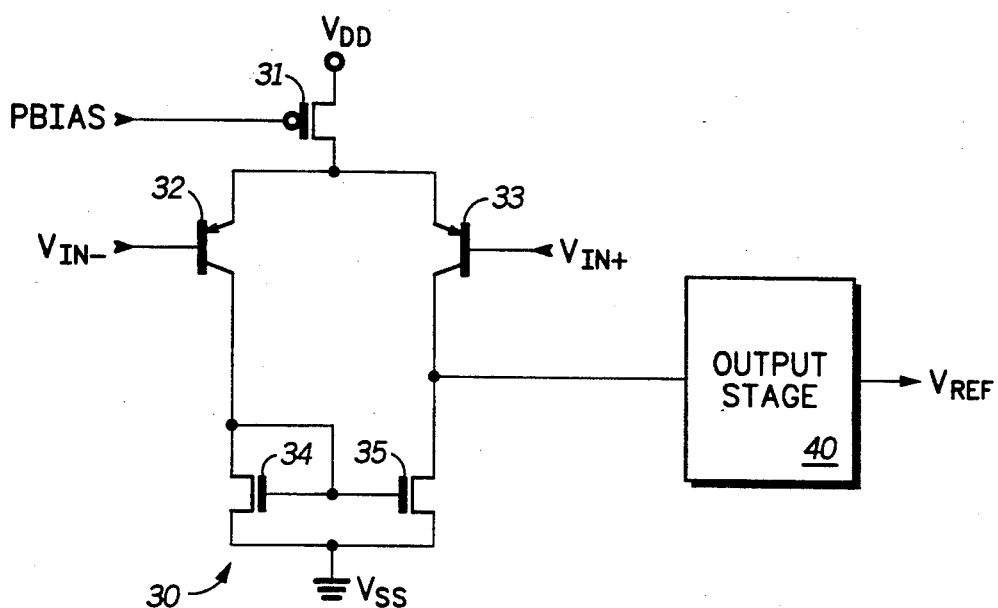
FIG. 1 illustrates in partial schematic form and partial block diagram form a continuous-time differential amplifier according to the prior art.

FIG. 1 illustrates in partial schematic form and partial block diagram form a continuous-time differential amplifier 20 according to the prior art. Differential amplifier 20 includes generally an input stage 30 and an output stage 40. Input stage 30 includes a P-channel transistor 31, PNP lateral bipolar transistors 32 and 33, and N-channel transistors 34 and 35. Transistor 31 has a source connected to a power supply voltage terminal labelled "$V_{DD}$", a gate for receiving a bias voltage labelled "PBIAS", and a drain. $V_{DD}$ is a more-positive power supply voltage terminal having a typical value of 5.0 volts. Transistor 32 has an emitter connected to the drain of transistor 31, a base for providing a negative input terminal of differential amplifier 20 and receiving a signal labelled "$V_{IN-}$" thereon, and a collector. Transistor 33 has an emitter connected to the drain of transistor 31, a base for providing a positive input terminal of differential amplifier 20 and receiving a signal labelled "$V_{IN+}$", and a collector. Transistor 34 has a drain connected to the collector of transistor 32, a gate connected to the drain thereof, and a source connected to a power supply voltage terminal labelled "$V_{SS}$". $V_{SS}$ is a more-negative power supply voltage terminal having a typical value of zero volts. Transistor 35 has a drain connected to the collector of transistor 33, a gate connected to the drain of transistor 34, and a source connected to $V_{SS}$. Output stage 40 has an input connected to the collector of transistor 33, and an output for providing a voltage labelled "$V_{REF}$".

Amplifier 20 provides reference voltage $V_{REF}$ continuously, and provides a fast settling time as a load to which amplifier 20 is connected (not shown) changes. Transistor 31 operates as a current source, and the current provided from the drain of transistor 31 is selectively steered through different circuit branches in response to a differential voltage between signals $V_{IN+}$ and $V_{IN-}$. MOS transistors 34 and 35, connected to the collectors of transistors 32 and 33, function as a load pair.

The input-referred offset voltage of amplifier 20 can be approximated as follows:

$$V_{IROS} \approx V_{OS1} + (g_{m2}/g_{m1})V_{OS2} \qquad [1]$$

where $V_{IROS}$ is equal to the overall input-referred offset voltage, $V_{OS1}$ is equal to the offset voltage between input bipolar transistors 32 and 33, $g_{m1}$ is equal to the transconductance of input bipolar transistors 32 and 33, $g_{m2}$ is equal to the tranconductance of MOS load transistors 34 and 35, and $V_{OS2}$ is equal to the offset voltage of transistors 34 and 35. Thus $V_{IROS}$ includes both the offset voltage of input bipolar transistors 32 and 33, and a term related to the offset voltage of MOS load transistors 34 and 35. Under typical transistor sizings, the $((g_{m2}/g_{m1})V_{OS2})$ term is much larger than the $V_{OS1}$ term.

The typical transistor sizings may be changed in two ways to reduce the input-referred offset voltage. First, increasing the gate area of transistors 34 and 35 reduces $V_{IROS}$ by reducing $V_{OS2}$. Second, decreasing the gate width-to-gate length ratio ("W/L") of transistors 34 and 35 reduces the transistors' transconductance, which reduces $(g_{m2}/g_{m1})$. If both these changes are made simultaneously, then the $((g_{m2}/g_{m1})V_{OS2})$ term may be reduced, for example to approximately the same size as the $V_{OS1}$ term.

However these changes tend to decrease stability. The parasitic pole frequency of the load pair is approximately equal to $(g_{m2}/(C_{gs34}+C_{gs35}))$, where $C_{gs34}$ is equal to the gate-to-source capacitance of transistor 34, and $C_{gs35}$ is equal to the gate-to-source capacitance of transistor 35. Increasing gate area increases $(C_{gs34}+C_{gs35})$, and decreasing W/L reduces $g_{m2}$, both reducing the parasitic pole frequency. For reasonable stability, the amplifier unity-gain frequency must be made less than the parasitic pole frequency. However, reducing the unity-gain frequency increases settling time.

Figure 2:
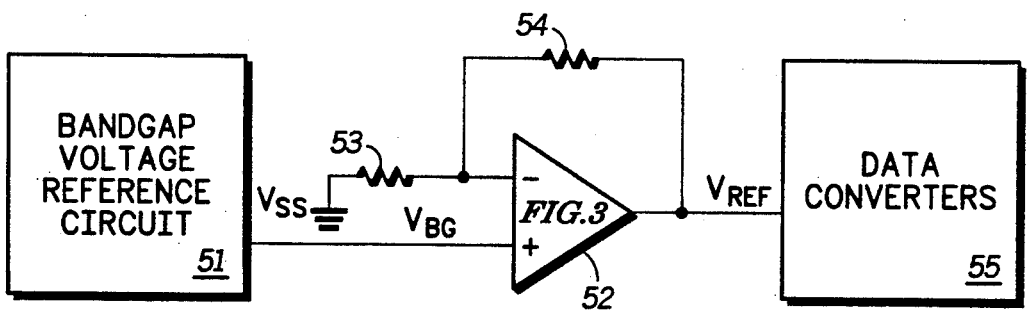
FIG. 2 illustrates in partial schematic form, partial logic diagram form, and partial block diagram form a signal processing system with a data converter, in accordance with the present invention.

FIG. 2 illustrates in partial schematic form, partial logic diagram form, and partial block diagram form a signal processing system 50 with data converters 55, in accordance with the present invention. Signal processing system 50 also includes a bandgap voltage reference circuit 51, a continuous-time, low offset differential amplifier 52, and resistors 53 and 54. Bandgap voltage reference circuit 51 provides a temperature-stable bandgap reference voltage labelled "$V_{BG}$". Amplifier 52 has a positive input terminal for receiving voltage $V_{BG}$, a negative input terminal, and an output terminal for providing a reference voltage labelled "$V_{REF}$" to data converters 55. Resistor 53 has a first terminal connected to $V_{SS}$, and a second terminal connected to the negative input terminal of amplifier 52. Resistor 54 has a first terminal connected to the negative input terminal of differential amplifier 52, and a second terminal connected to the output terminal of amplifier 52.

Data converters 55 include both an ADC and a DAC which require a precision reference voltage. Since $V_{BG}$ is determined by the manufacturing process, $V_{BG}$ must be modified to equal the desired reference voltage. Furthermore, it is desirable for the reference voltage to settle quickly after the loading in data converters 55 changes. Signal processing system 50 has improved performance by including continuous-time, low offset differential amplifier 52 with resistors 53 and 54 included to set the gain thereof.

Figure 3:
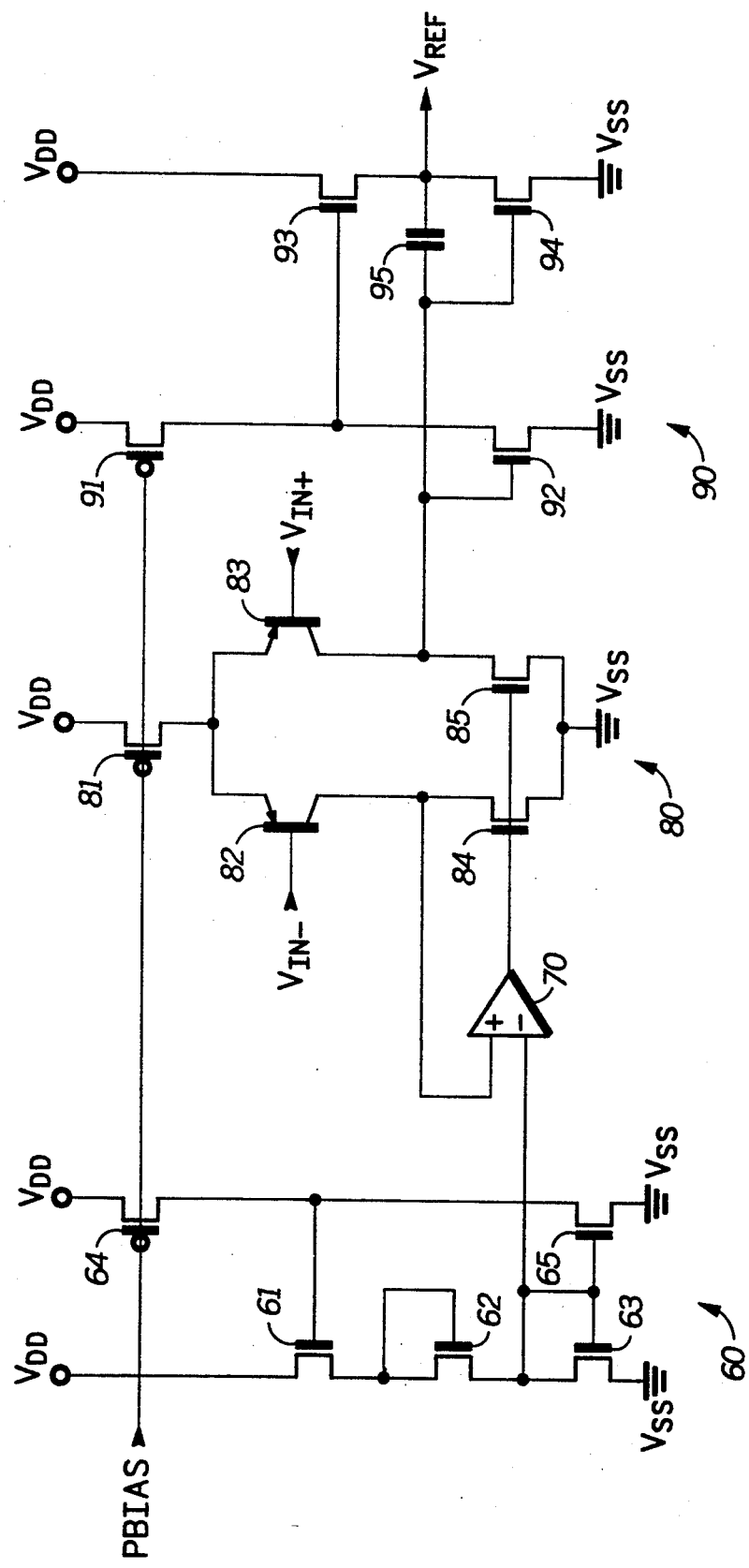
FIG. 3 illustrates in partial schematic form and partial logic diagram form the continuous-time differential amplifier of FIG. 2.

FIG. 3 illustrates in partial schematic form and partial logic diagram from continuous-time differential amplifier 52 of FIG. 2. Differential amplifier 52 simultaneously provides a fast settling time and reduced offset voltage. In contrast, amplifier 20 of FIG. 1 could be implemented with either a fast settling time or a low offset voltage, but not both. Differential amplifier 52 includes generally a bias portion 60, a transconductance amplifier 70, a differential stage 80, and an output stage 90.

Bias portion 60 includes N-channel transistors 61–63, a P-channel transistor 64, and an N-channel transistor 65. Transistor 61 has a drain connected to $V_{DD}$, a gate, and a source. Transistor 62 has a drain connected to the source of transistor 61, a gate connected to the drain thereof, and a source. Transistor 63 has a drain connected to the source of transistor 62, a gate connected to the drain thereof, and a source connected to $V_{SS}$. Transistor 64 has a source connected to $V_{DD}$, a gate for receiving a voltage labelled "PBIAS", and a drain connected to the gate of transistor 61. PBIAS is a voltage which biases P-channel transistors sized like transistor 64 to provide a substantially constant current. Transistor 65 has a drain connected to the drain of transistor 64, a gate connected to the drain of transistor 62, and a source connected to $V_{SS}$. Transconductance amplifier 70 has a positive input terminal, a negative input terminal connected to the drain of transistor 62, and an output terminal.

Differential stage 80 includes a P-channel transistor 81, PNP lateral bipolar transistors 82 and 83, and N-channel transistors 84 and 85. Transistor 81 has a source connected to $V_{DD}$, a gate for receiving voltage PBIAS, and a drain. Transistor 82 has an emitter connected to the drain of transistor 81, a base for providing the negative input terminal of amplifier 52 and receiving signal $V_{IN-}$ thereon, and a collector connected to the positive input terminal of transconductance amplifier 70. Transistor 83 has an emitter connected to the drain of transistor 81, a base for providing the positive input terminal of amplifier 52 and receiving signal $V_{IN+}$ thereon, and a collector. Transistor 84 has a drain connected to the collector of transistor 82, a gate connected to the output terminal of transconductance amplifier 70, and a source connected to $V_{SS}$. Transistor 85 has a drain connected to the collector of transistor 83, a gate connected to the output terminal of transconductance amplifier 70, and a source connected to $V_{SS}$.

Output stage 90 includes a P-channel transistor 91, N-channel transistors 92-94, and a capacitor 95. Transistor 91 has a source connected to $V_{DD}$, a gate for receiving voltage PBIAS, and a drain. Transistor 92 has a drain connected to the drain of transistor 91, a gate connected to the collector of transistor 83, and a source connected to $V_{SS}$. Transistor 93 has a drain connected to $V_{DD}$, a gate connected to the drain of transistor 91, and a source for providing output signal $V_{REF}$. Transistor 94 has a drain connected to the source of transistor 93, a gate connected to the collector of transistor 83, and a source connected to $V_{SS}$. Capacitor 95 has a first terminal connected to the collector of transistor 83, and a second terminal connected to the drain of transistor 94.

Transistor 81 provides a constant current at the drain thereof, which is selectively steered through transistors 82 and 83 in response to a difference in voltage between $V_{IN+}$ and $V_{IN-}$. Transistors 84 and 85 function as load transistors. Amplifier 70 biases the gates of transistors 84 and 85 and changes the voltage at its output terminal until the voltage at its positive input terminal (the drain of transistor 84) is equal to the voltage at its negative input terminal (the drain of transistor 63). Amplifier 70 is preferably a single-stage amplifier with a large transconductance for stability and preferably has low offset voltage. Bias portion 60 provides the voltage at the gate of transistor 65 to be approximately equal to the voltage at the gate of transistor 92. Transistors 61-63 provide improved matching between the $V_{DS}$ of transistor 65 and the $V_{DS}$ of transistor 92.

If $V_{IN+}$ exceeds $V_{IN-}$, then transistor 82 is relatively more conductive than transistor 83, and most of the current of transistor 81 is conducted through transistor 82. The voltage at the collector of transistor 83 falls, making transistors 92 and 94 less conductive and increasing output voltage $V_{REF}$. If $V_{IN-}$ exceeds $V_{IN+}$, then the voltage at the collector of transistor 83 rises, making transistors 92 and 94 more conductive, and decreasing voltage $V_{REF}$. Capacitor 95 is provided for dominant pole compensation. Transistor 91 is matched to transistor 64, and transistor 92 is matched to transistor 65.

Amplifier 70 is a wide-bandwidth amplifier which provides an effective $g_m$ of the closed-loop system (of amplifier 70 and transistor 84) equal to the gain of amplifier 70 multiplied by the $g_m$ of transistor 84. Thus amplifier 70 moves the non-dominant pole frequency of the closed-loop system to a much-higher frequency compared to the non-dominant pole frequency of load transistor 34 and 35 of FIG. 1. Thus, the bandwidth of differential amplifier 52 may be made large and the settling time may be reduced without degrading stability. This improvement prevents degradation to settling time which would normally occur with MOS load transistors having large gate areas. Thus, transistors 84 and 85 may have large areas in order to reduce the input-referred offset.

Differential amplifier 52 is especially useful in situations in which only one bipolar transistor conductivity type is available. If the manufacturing process provided both NPN and PNP transistors, then a continuous-time differential amplifier using both transistor types could be built. This amplifier would not have a large input-referred offset because bipolar transistors may be better matched.

Figure 4:
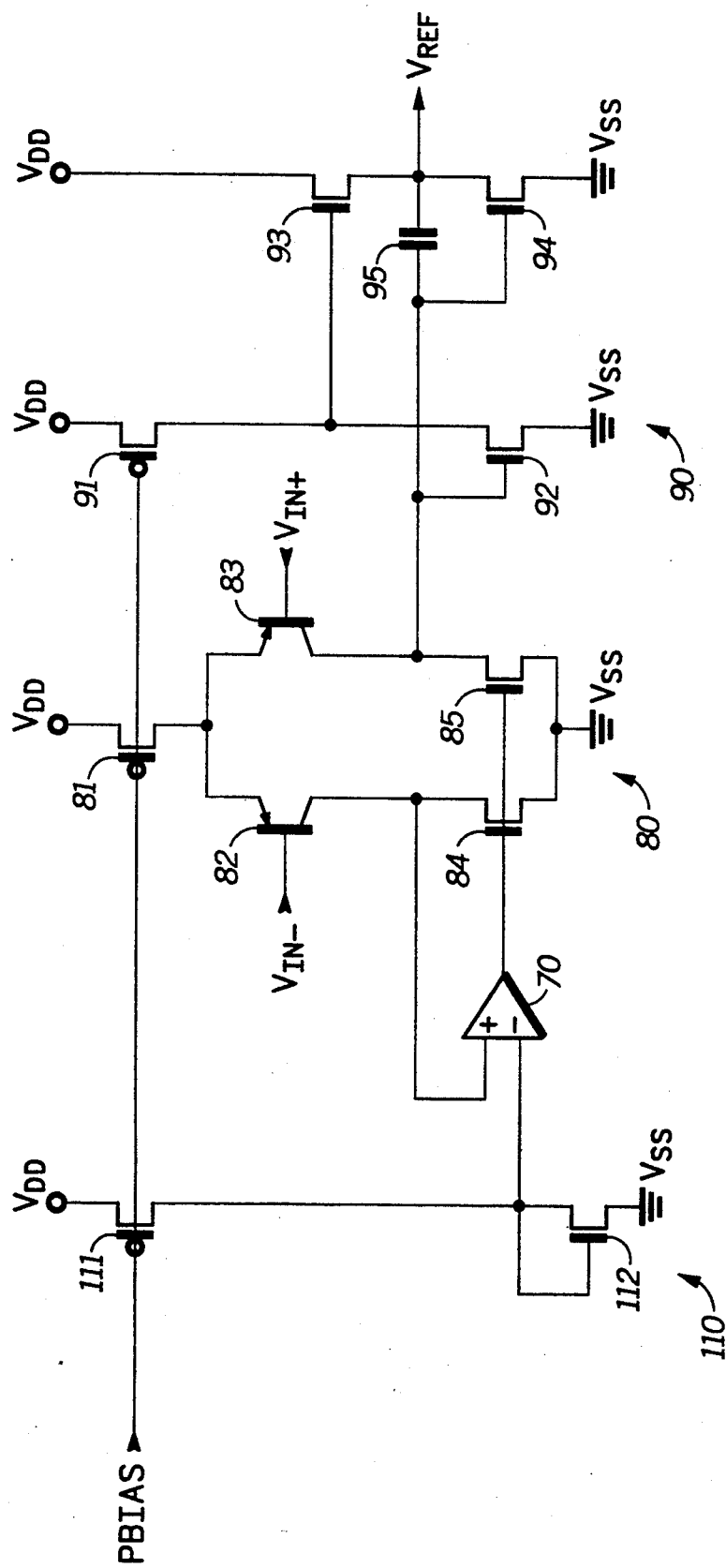
FIG. 4 illustrates in schematic form a second embodiment of a continuous-time differential amplifier in accordance with the present invention.

FIG. 4 illustrates in schematic form a second embodiment of a continuous-time differential amplifier 100 in accordance with the present invention. Differential amplifier 100 differs from differential amplifier 52 of FIG. 3 by the inclusion of a different bias portion 110. All other elements are the same and retain their previous reference numbers. Bias portion 110 includes a P-channel transistor 111 and an N-channel transistor 112. P-channel transistor 111 has a source connected to $V_{DD}$, a gate for receiving bias voltage PBIAS, and a drain. Transistor 112 has a drain connected to the drain of transistor 111, a gate connected to the drain thereof, and a source connected to $V_{SS}$. Differential amplifier 100 has reduced circuit area compared to differential amplifier 52 of FIG. 3 because bias portion 110 includes only two transistors, as opposed to five transistors of bias portion 60. Thus, where extremely precise offset voltage matching is not necessary, bias portion 110 may be used to conserve circuit area.

Figure 5:
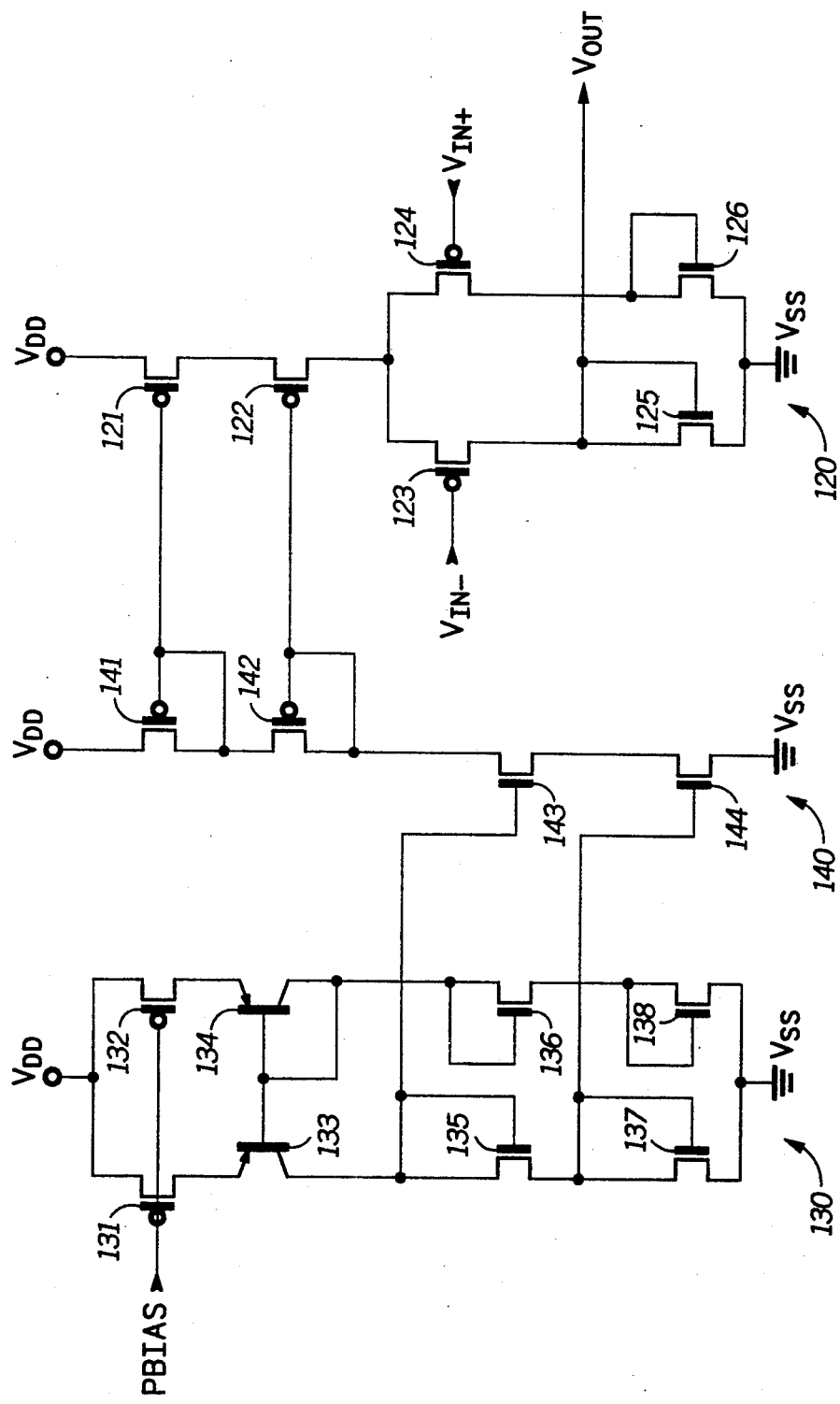
FIG. 5 illustrates in schematic form the transconductance amplifier of FIGS. 3 and 4.

FIG. 5 illustrates in schematic form transconductance amplifier 70 of FIGS. 3 and 4. Amplifier 70 includes generally an amplifier stage 120, a reference portion 130, and a mirror portion 140.

Amplifier stage 120 includes P-channel transistors 121-124, and N-channel transistors 125 and 126. Transistor 121 has a source connected to $V_{DD}$, a gate, and a drain. Transistor 122 has a source connected to the drain of transistor 121, a gate, and a drain. Transistor 123 has a source connected to the drain of transistor 122, a gate for providing the negative input terminal of amplifier 70 and receiving signal $V_{IN-}$ thereon (and connected to the drain of transistor 63 in amplifier 52 of FIG. 3 and connected to the drain of transistor 112 of amplifier 100 of FIG. 4), and a drain for providing an output signal labelled "$V_{OUT}$" (connected to the gates of transistors 84 and 85 in input stage 80 of both amplifier 52 of FIG. 3 and amplifier 100 of FIG. 4). Transistor 124 has a source connected to the drain of transistor 122, a gate for providing the positive input terminal of amplifier 70 and receiving signal $V_{IN+}$ thereon (and connected to the drain of transistor 84 in input stage 80 of both amplifier 52 of FIG. 3 and amplifier 100 of FIG. 4), and a drain. Transistor 125 has a drain connected to the drain of transistor 123, a gate connected to the drain thereof, and a source connected to $V_{SS}$. Transistor 126 has a drain connected to the drain of transistor 124, a gate connected to the drain thereof, and a source connected to $V_{SS}$.

Reference portion 130 includes P-channel transistors 131 and 132, PNP transistors 133 and 134, and N-channel transistors 135-138. Transistor 131 has a source connected to $V_{DD}$, a gate for receiving voltage PBIAS, and a drain. Transistor 132 has a source connected to $V_{DD}$, a gate for receiving voltage PBIAS, and a drain. Transistor 133 has an emitter connected to the drain of transistor 131, a base, and a collector. Transistor 134 has an emitter connected to the drain of transistor 132, a base, and a collector connected to the base thereof and to the base of transistor 133. Transistor 135 has a drain connected to the collector of transistor 133, a gate connected to the drain thereof, and a source. Transistor 136 has a drain connected to the collector of transistor 134, a gate connected to the drain thereof, and a source. Transistor 137 has a drain connected to the source of transistor 135, a gate connected to the drain thereof, and a source connected to $V_{SS}$. Transistor 138 has a drain connected to the source of transistor 136, a gate connected to the drain thereof, and a source connected to $V_{SS}$.

Current mirror portion 140 includes P-channel transistors 141 and 142, and N-channel transistors 143 and 144. Transistor 141 has a source connected to $V_{DD}$, a gate, and a drain connected to the gate thereof and to the gate of transistor 121. Transistor 142 has a source connected to the drain of transistor 141, a gate, and a drain connected to the gate thereof and to the gate of transistor 122. Transistor 143 has a drain connected to the drain of transistor 142, a gate connected to the drain of transistor 135, and a source. Transistor 144 has a drain connected to the source of transistor 143, a gate connected to the drain of transistor 137, and a source connected to $V_{SS}$.

Amplifier 70 is a single amplification stage (input stage 120) and provides signal $V_{OUT}$ to bias transistors 84 and 85 in FIGS. 3 and 4. Reference portion 130 provides current references which are mirrored with an increased mirror ratio through current mirror stage 140 to transistors 121 and 122. Thus, the current in transistors 121 and 122 is scaled-up proportionally to the collector current of transistor 133, providing a high $g_m$ for amplifier 70 and preserving closed-loop stability. In the illustrated embodiment, the mirror ratio of current mirror portion 140 is equal to the sizing ratio of transistor 125 to transistor 84 of FIGS. 3 and 4. Reference portion 130 provides transistors 132, 134, 136, and 138 to properly bias the base of transistor 133. Lateral bipolar transistor 133 is provided to compensate for a systematic variation in the free collector current of transistors 82 and 83 due to their being lateral bipolar transistors. If the manufacturing process provides a lateral bipolar transistor having a relatively-high substrate collector current for transistors 82 and 83, then transistor 133 will have a correspondingly-high substrate collector current which will compensate therefor.

While the invention has been described in the context of a preferred embodiment, it will be apparent to those skilled in the art that the present invention may be modified in numerous ways and may assume many embodiments other than that specifically set out and described above. For example, in the illustrated embodiment, input stage 80 included a P-channel transistor acting as a current source, PNP lateral bipolar input transistors, and N-channel load transistors. Another embodiment in accordance with the present invention could include transistor with complementary conductivity types to those of the illustrated embodiment. Such an embodiment includes P-channel load transistors, NPN lateral bipolar input transistors, and an N-channel transistor acting as a current source. Also certain transistors such as transistors 64, 81, and 91 function as current sources and could be replaced by other types of current sources. Accordingly, it is intended by the appended claims to cover all modifications of the invention which fall within the true spirit and scope of the invention.

I claim:

1. A continuous-time differential amplifier with low offset voltage comprising:
   a first transistor having a first current electrode coupled to a first power supply voltage terminal, a control electrode for receiving a first bias voltage, and a second current electrode;
   a second transistor having an emitter coupled to said second current electrode of said first transistor, a base for receiving a negative input signal, and a collector;
   a third transistor having an emitter coupled to said second current electrode of said first transistor, a base for receiving a positive input voltage, and a collector for providing an output signal;
   a fourth transistor having a first current electrode coupled to said collector of said second transistor, a control electrode, and a second current electrode coupled to a second power supply voltage terminal;
   a fifth transistor having a first current electrode coupled to said collector of said third transistor, a control electrode, and a second current electrode coupled to a second power supply voltage terminal;
   an amplifier having a positive input terminal coupled to said collector of said second transistor, a negative input terminal for receiving a second bias voltage, and an output terminal coupled to said control electrodes of said fourth and fifth transistors; and
   bias means for providing said second bias voltage, said bias means comprising:
   a sixth transistor having a first current electrode coupled to said first power supply voltage terminal, a control electrode, and a second current electrode;
   a seventh transistor having a first current electrode coupled to said second current electrode of said sixth transistor, a control electrode coupled to said second current electrode of said sixth transistor, and a second current electrode coupled for providing said second bias voltage;
   an eighth transistor having a first current electrode coupled to said second current electrode of said seventh transistor, a control electrode coupled to said second current electrode of said seventh transistor, and a second current electrode coupled to said second power supply voltage terminal;
   a ninth transistor having a first current electrode coupled to said first power supply voltage terminal, a control electrode for receiving said first bias voltage, and a second current electrode coupled to said control electrode of said sixth transistor; and
   a tenth transistor having a first current electrode coupled to said second current electrode of said ninth transistor, a control electrode coupled to said second current electrode of said seventh transistor, and a second current electrode coupled to said second power supply voltage terminal.

2. A continuous-time differential amplifier with low offset voltage comprising:
   a first transistor having a first current electrode coupled to a first power supply voltage terminal, a control electrode for receiving a first bias voltage, and a second current electrode;
   a second transistor having an emitter coupled to said second current electrode of said first transistor, a base for receiving a negative input signal, and a collector;
   a third transistor having an emitter coupled to said second current electrode of said first transistor, a base for receiving a positive input voltage, and a collector for providing an output signal;
   a fourth transistor having a first current electrode coupled to said collector of said second transistor, a control electrode, and a second current electrode coupled to a second power supply voltage terminal;

a fifth transistor having a first current electrode coupled to said collector of said third transistor, a control electrode, and a second current electrode coupled to a second power supply voltage terminal; and an amplifier having a positive input terminal coupled to said collector of said second transistor, a negative input terminal for receiving a second bias voltage, and an output terminal coupled to said control electrodes of said fourth and fifth transistors, said amplifier comprising:

an amplifier stage for selectively diverting a first current in response to differences in voltage between said positive input terminal of said amplifier and said negative input terminal of said amplifier, and for providing a voltage at said output terminal of said amplifier in response thereto;

means for providing a reference current proportional to a second current conducted by a sixth transistor biased by said first bias voltage minus a substrate collector current of a seventh lateral bipolar transistor; and means for mirroring said reference current to said amplifier stage to provide said first current.

3. The differential amplifier of claim 2 wherein said providing means comprises:

said sixth transistor having a first current electrode coupled to said first power supply voltage terminal, a control electrode for receiving said first bias voltage, and a second current electrode;

said seventh lateral bipolar transistor having an emitter coupled to said second current electrode of said sixth transistor, a base, and a collector for providing a first voltage to said mirroring means;

an eighth transistor having a first current electrode coupled to said collector of said seventh lateral bipolar transistor, a control electrode coupled to said collector of said seventh lateral bipolar transistor, and a second current electrode for providing a second voltage to said mirroring means;

a ninth transistor having a first current electrode coupled to said second current electrode of said eighth transistor, a control electrode coupled to said second current electrode of said eighth transistor, and a second current electrode coupled to said second power supply voltage terminal;

a tenth transistor having a first current electrode coupled to said first power supply voltage terminal, a control electrode for receiving said first bias voltage, and a second current electrode;

an eleventh lateral bipolar transistor having an emitter coupled to said second current electrode of said tenth transistor, a base, and a collector coupled to said base of said seventh bipolar transistor and to said base of said eleventh lateral bipolar transistor;

a twelfth transistor having a first current electrode coupled to said collector of said eleventh lateral bipolar transistor, a control electrode coupled to said first current electrode thereof, and a second current electrode; and a thirteenth transistor having a first current electrode coupled to said second current electrode of said twelfth transistor, a control electrode coupled to said second current electrode of said twelfth transistor, and a second current electrode coupled to said second power supply voltage terminal.

4. The differential amplifier of claim 2 wherein said second and third transistors are characterized as being lateral bipolar transistors.

5. A signal processing system comprising:

a bandgap voltage reference circuit providing a bandgap reference voltage at an output thereof;

a differential amplifier having a positive terminal for receiving said bandgap reference voltage, a negative input terminal, and an output terminal for providing a reference voltage;

means coupled to said differential amplifier for setting a gain thereof; and data conversion means coupled to said differential amplifier for performing at least one data conversion operation referenced to said reference voltage;

said differential amplifier further comprising:

an amplifier having a positive input terminal, a negative input terminal for receiving a bias voltage thereon, and an output terminal;

first and second emitter-coupled bipolar transistors each having a collector and respectively receiving a first and second input signals at bases thereof;

a third transistor having a first current electrode coupled to a first power supply voltage terminal, a control electrode for receiving a second bias voltage, and a second current electrode coupled to said emitters of said first and second lateral bipolar transistors; and fourth and fifth load transistors respectively coupled between said collectors of said first and second bipolar transistors and a second power supply voltage terminal and having control electrodes coupled to said output terminal of said amplifier;

said collectors of said first and second bipolar transistors providing first and second output terminals of said differential amplifier, wherein said amplifier comprises:

an amplifier stage for selectively diverting a first current in response to differences in voltage between said positive input terminal of said amplifier and said negative input terminal of said amplifier, and for providing a voltage at said output terminal of said amplifier in response thereto;

means for providing a reference current proportional to a second current conducted by a sixth transistor biased by said second bias voltage minus a substrate collector current of a seventh lateral bipolar transistor; and means for mirroring said reference current to said amplifier stage to provide said first current.

6. The differential amplifier of claim 5 wherein said providing means comprises:

said sixth transistor having a first current electrode coupled to said first power supply voltage terminal, a control electrode for receiving said second bias voltage, and a second current electrode;

said seventh lateral bipolar transistor having an emitter coupled to said second current electrode of said sixth transistor, a base, and a collector for providing a first voltage to said mirroring means;

an eighth transistor having a first current electrode coupled to said collector of said seventh lateral bipolar transistor, a control electrode coupled to said collector of said seventh lateral bipolar transistor, and a second current electrode for providing a second voltage to said mirroring means;

a ninth transistor having a first current electrode coupled to said second current electrode of said eighth transistor, a control electrode coupled to said second current electrode of said eighth transistor, and a second current electrode coupled to said second power supply voltage terminal;

a tenth transistor having a first current electrode coupled to said first power supply voltage terminal, a control electrode for receiving said second bias voltage, and a second current electrode;

an eleventh lateral bipolar transistor having an emitter coupled to said second current electrode of said tenth transistor, a base, and a collector coupled to said base of said seventh bipolar transistor and to said base of said eleventh lateral bipolar transistor;

a twelfth transistor having a first current electrode coupled to said collector of said eleventh lateral bipolar transistor, a control electrode coupled to said first current electrode thereof, and a second current electrode; and a thirteenth transistor having a first current electrode coupled to said second current electrode of said twelfth transistor, a control electrode coupled to said second current electrode of said twelfth transistor, and a second current electrode coupled to said second power supply voltage terminal.

7. The differential amplifier of claim 5 wherein said first and second emitter-coupled bipolar transistors are characterized as being lateral bipolar transistors.

* * * * *